US011055087B2

(12) United States Patent
Mahbod et al.

(10) Patent No.: US 11,055,087 B2
(45) Date of Patent: Jul. 6, 2021

(54) LEVERAGING PREVIOUSLY INSTALLED APPLICATION ELEMENTS TO INSTALL AN APPLICATION

(71) Applicant: Google LLC, Mountain View, CA (US)

(72) Inventors: Aurash Jonathan Mahbod, San Jose, CA (US); Vachaspati Hemmige Varadarajan, Palo Alto, CA (US); Jacob Peter Slack, Sunnyvale, CA (US); Liyuan Gao, Mountain View, CA (US); Jeff Hao, Dublin, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 16/020,762

(22) Filed: Jun. 27, 2018

(65) Prior Publication Data
US 2019/0286437 A1    Sep. 19, 2019

Related U.S. Application Data

(60) Provisional application No. 62/644,166, filed on Mar. 16, 2018.

(51) Int. Cl.
*G06F 8/658* (2018.01)
*G06F 8/61* (2018.01)
(Continued)

(52) U.S. Cl.
CPC ............... *G06F 8/658* (2018.02); *G06F 8/61* (2013.01); *G06F 8/64* (2013.01); *G06F 8/65* (2013.01);
(Continued)

(58) Field of Classification Search
CPC ... G06F 8/658; G06F 8/61; G06F 8/64; G06F 8/65; G06F 8/71; H04L 67/34; H03M 7/30
See application file for complete search history.

(56) References Cited

U.S. PATENT DOCUMENTS 6,560,771 B1 * 5/2003 Yotsukura ................. G06F 8/20
717/116
6,640,334 B1 * 10/2003 Rasmussen ............... G06F 8/65
717/169

(Continued)

FOREIGN PATENT DOCUMENTS

WO          03001377 A2    1/2003

OTHER PUBLICATIONS

International Search Report and Written Opinion of International Application No. PCT/US2019/019831, dated May 23, 2019, 77 pp.
(Continued)

*Primary Examiner* — Douglas M Slachta
(74) *Attorney, Agent, or Firm* — Shumaker & Sieffert, P.A.

(57) ABSTRACT

One or more processors of a computing device may receive, from an external computing device, a first one or more application elements of a plurality of application elements of a first application that is to be installed at the computing device. The one or more processors may further obtain from a second application that is installed at the computing device, a second one or more application elements of the plurality of application elements of the first application that is to be installed at the computing device. The one or more processors may further install, using the first one or more application elements and the second one or more application elements, the first application at the computing device.

20 Claims, 6 Drawing Sheets

(51) Int. Cl.
*G06F 8/71* (2018.01)
*G06F 8/65* (2018.01)
*H04L 29/08* (2006.01)
*H03M 7/30* (2006.01)

(52) U.S. Cl.
CPC ............... *G06F 8/71* (2013.01); *H04L 67/34* (2013.01); *H03M 7/30* (2013.01)

(56) References Cited

U.S. PATENT DOCUMENTS

| | | | | |
|---|---|---|---|---|
| 6,999,976 | B2* | 2/2006 | Abdallah | G06F 16/10 717/118 |
| 7,203,739 | B2* | 4/2007 | Ohto | H04L 51/06 709/219 |
| 7,461,373 | B2* | 12/2008 | Herle | G06F 8/658 717/171 |
| 7,640,363 | B2* | 12/2009 | Teodosiu | H03M 7/30 707/999.202 |
| 7,747,995 | B2* | 6/2010 | Fritsch | H04W 8/22 717/168 |
| 8,060,874 | B2* | 11/2011 | Rengarajan | G06F 8/65 717/177 |
| 8,082,442 | B2* | 12/2011 | Keljo | G06F 21/57 713/164 |
| 8,594,653 | B2* | 11/2013 | Zeilingold | G06F 8/65 455/419 |
| 8,640,088 | B2* | 1/2014 | Hamilton, II | G06F 8/36 713/190 |
| 9,038,059 | B2* | 5/2015 | Ellis | G06F 8/61 717/174 |
| 9,043,778 | B2* | 5/2015 | Lin | G06F 8/65 717/170 |
| 10,050,845 | B2* | 8/2018 | Cui | H04L 41/22 |
| 2002/0147606 | A1* | 10/2002 | Hoffmann | G06F 8/34 717/100 |
| 2003/0046282 | A1* | 3/2003 | Carlson | G06F 8/36 |
| 2003/0177485 | A1* | 9/2003 | Waldin, Jr. | G06F 8/658 717/169 |
| 2004/0003266 | A1 | 1/2004 | Moshir et al. | |
| 2004/0003389 | A1 | 1/2004 | Reynar et al. | |
| 2006/0150147 | A1* | 7/2006 | Tatsubori | G06F 8/36 717/108 |
| 2007/0067373 | A1 | 3/2007 | Higgins et al. | |
| 2007/0157190 | A1* | 7/2007 | Shiu | G06F 8/20 717/162 |
| 2007/0169043 | A1* | 7/2007 | Violleau | G06F 9/526 717/149 |
| 2007/0180206 | A1* | 8/2007 | Craft | G06F 11/1466 711/162 |
| 2010/0257520 | A1* | 10/2010 | Navarro | G06F 8/65 717/173 |
| 2012/0233590 | A1* | 9/2012 | Ranganathan | G06F 8/30 717/106 |
| 2014/0026113 | A1* | 1/2014 | Farooqi | G06F 8/34 717/107 |
| 2014/0245287 | A1* | 8/2014 | Enokizono | G06F 8/658 717/175 |
| 2015/0301824 | A1* | 10/2015 | Patton | G06F 8/71 717/122 |
| 2017/0123777 | A1* | 5/2017 | Mittal | G06F 8/71 |
| 2017/0147298 | A1* | 5/2017 | Ramanathan | G06F 8/36 |
| 2017/0147330 | A1* | 5/2017 | Saraswati | G06F 8/656 |
| 2017/0322824 | A1* | 11/2017 | Reuther | G06F 3/0632 |
| 2018/0267796 | A1* | 9/2018 | Kennedy | G06F 8/71 |
| 2018/0267990 | A1* | 9/2018 | Cherukuri | G06F 9/45533 |

OTHER PUBLICATIONS

International Preliminary Report on Patentability from counterpart PCT Application No. PCT/US2019/019831 dated Oct. 1, 2020, 8 pgs.

* cited by examiner

LEVERAGING PREVIOUSLY INSTALLED APPLICATION ELEMENTS TO INSTALL AN APPLICATION

RELATED APPLICATION

This application claims the benefit of U.S. Provisional Patent Application No. 62/644,166, filed Mar. 16, 2018, the entire content of which is hereby incorporated by reference.

BACKGROUND

A computing device may have hundreds of applications that are installed at the computing device. The computing device can download and install applications by downloading applications from an external computing device, such as a remote server. Typically, an application that is installed at the computing device may be a package of application elements that enable successful operation of the application at the computing device. For example, an application may include executable code that can be executed at the computing device, resources that the executable code may access during execution, as well as libraries that are linked into the executable code.

SUMMARY

In general, techniques of this disclosure may enable the computing device to more efficiently download applications by leveraging the content of applications that are already installed at the computing device. When the computing device requests an application that is to be installed at the computing device from an application provider server, the application provider server may not necessarily send every one of the application elements of the application to the computing device to install the application. Instead, the application provider server may determine whether one or more application elements of the application can be obtained from other applications that are already installed at the computing device. Responsive to determining that one or more application elements of the application are available from the other application, application provider server may direct the computing device to obtain the one or more application elements of the application from an already-installed application at the computing device. In this way, the techniques of this disclosure may reduce the amount of data that is sent from the application provider server and received by the computing device to install an application at the computing device.

Accordingly, the described techniques may improve the functioning of the computing device, as well as a computing system that includes the computing device and the application provider server. By reusing application elements of applications that are already installed at the computing device to install or update an unrelated application, the described techniques reduces the amount of network bandwidth that is used to transfer elements of the application that is to be installed at the computing device, and increases the speed of application installs at the computing device.

In one aspect, the disclosure is directed to a method. The method may include receiving, by one or more processors of a computing device from an external computing device, a first one or more application elements of a plurality of application elements of a first application that is to be installed at the computing device. The method may further include obtaining, by the one or more processors and from a second application that is installed at the computing device, a second one or more application elements of the plurality of application elements of the first application that is to be installed at the computing device. The method may further include installing, by the one or more processors and using the first one or more application elements and the second one or more application elements, the first application at the computing device.

In another aspect, the disclosure is directed to a computing device. The computing device may include a memory. The computing device may further include one or more processors operably coupled to the memory and configured to: receive, from an external computing device, a first one or more application elements of a plurality of application elements of a first application that is to be installed at the computing device; obtain from a second application that is installed at the computing device, a second one or more application elements of the plurality of application elements of the first application that is to be installed at the computing device; and install, using the first one or more application elements and the second one or more application elements, the first application at the computing device.

In another aspect, the disclosure is directed to a computing system. The computing system may include an external computing device. The computing system may further include a computing device operably connected to the computing device via a network that is operable to: receive, from the external computing device, a first one or more application elements of a plurality of application elements of a first application that is to be installed at the computing device; obtain from a second application that is installed at the computing device, a second one or more application elements of the plurality of application elements of the first application that is to be installed at the computing device; and install, using the first one or more application elements and the second one or more application elements, the first application at the computing device.

The details of one or more examples are set forth in the accompanying drawings and the description below. Other features, objects, and advantages of the disclosure will be apparent from the description and drawings, and from the claims.

DETAILED DESCRIPTION

Figure 1:
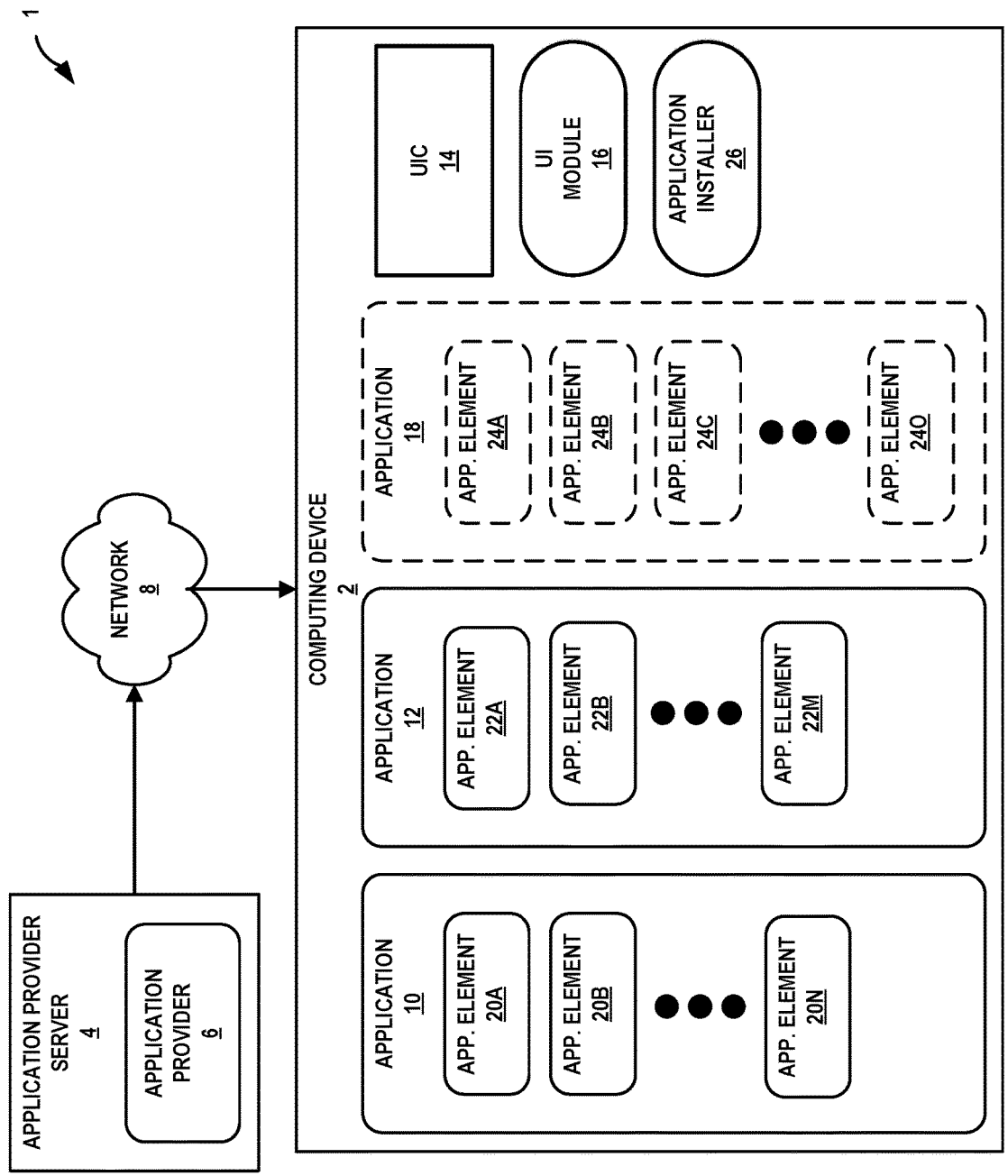
FIG. 1 is a conceptual diagram illustrating an example computing system in which a computing device can download an application from an application provider server and can install the downloaded application at the computing device, in accordance with one or more aspects of the present disclosure.

FIG. 1 is a conceptual diagram illustrating an example computing system in which a computing device can download an application from an application provider server and can install the downloaded application at the computing device, in accordance with one or more aspects of the present disclosure. As shown in FIG. 1, computing system 1 may include computing device 2 and application provider server 4. Computing device 2 may communicate with application provider server 4 via network 8 to download applications such as application 18, and may install the downloaded applications, such as application 18, at computing device 2. Network 8 represents any public or private communications network, for instance, cellular, Wi-Fi, and/or other types of networks, for transmitting data between computing systems, servers, and computing devices. Application provider server 4 may exchange data, via network 8, with computing device 2 to transfer applications to be installed on computing device 2 when computing device 2 is connected to network 8.

Network 8 may include one or more network hubs, network switches, network routers, or any other network equipment, that are operatively inter-coupled thereby providing for the exchange of information between application provider server 4 and computing device 2. Computing device 2 and application provider server 4 may transmit and receive data across network 8 using any suitable communication techniques. Computing device 2 and application provider server 4 may each be operatively coupled to network 8 using respective network links. The links coupling computing device 2 and application provider server 4 to network 8 may be Ethernet or other types of network connections and such connections may be wireless and/or wired connections.

Application provider server 4 may represent any suitable remote computing system, such as one or more desktop computers, laptop computers, mainframes, servers, cloud computing systems, etc. capable of sending and receiving information both to and from a network, such as network 7. In some examples, digital assistant server 160 may represent cloud computing systems that provide access to their respective services via a cloud.

Application provider server 4 hosts (or at least provides access to) application provider 6. Application provider 6 may perform operations described using hardware or a mixture of hardware, software, and firmware residing in and/or executing at application provider server 4. Application provider server 4 may execute application provider 6 with multiple processors or multiple devices. Application provider server 4 may also execute application provider 6 as virtual machines executing on underlying hardware. In some examples, application provider 6 may also execute as one or more services of an operating system or computing platform, or as one or more executable programs at an application layer of a computing platform.

Application provider 6 may execute at application provider server 4 to manage a repository of applications that may be downloaded to computing devices, and the installation and update of applications downloaded from application provider 6. Application provider 6 may receive requests for applications from computing devices, such as computing device 2, and to transfer the requested applications to the requesting computing devices for installation. Application provider 6 may also generate patches that are transferred to computing devices to update applications that are installed at the computing devices.

Computing device 2 may be a mobile or non-mobile computing device that is configured to request applications from application provider server 4, to receive the requested applications from application provider server 4, and to install the applications requested and received from application provider server 4. Examples of computing device 2 includes a mobile phone, a tablet computer, a laptop computer, a desktop computer, a server, a mainframe, a set-top box, a television, a wearable device (e.g., a computerized watch, computerized eyewear, computerized gloves, etc.), a home automation device or system (e.g., an intelligent thermostat or security system), a voice-interface or countertop home assistant device, a personal digital assistants (PDA), a gaming system, a media player, an e-book reader, a mobile television platform, an automobile navigation or infotainment system, or any other type of mobile, non-mobile, wearable, and non-wearable computing device.

In the example of FIG. 1, computing device 2 may include user interface component (UIC) 14, UI module 16, application installer 26, and applications 10 and 12. UI module 16, application installer 26, and applications 10 and 12 may perform operations described using hardware, or a combination of hardware and software and/or firmware residing in and/or executing at computing device 2. Computing device 2 may execute UI module 16, application installer 26, and applications 10 and 12 with multiple processors or multiple devices. In some cases, computing device 2 may execute UI module 16 and/or application installer 26 as virtual machines executing on underlying hardware. UI module 16 and/or application installer 26 may also execute as one or more services of an operating system or computing platform, or as one or more executable programs at an application layer of a computing platform.

UIC 14 of computing device 2 may function as an input and/or output device for computing device 2. UIC 14 may be implemented using various technologies. For instance, UIC 14 may function as an input device using presence-sensitive input screens, such as resistive touchscreens, surface acoustic wave touchscreens, capacitive touchscreens, projective capacitance touchscreens, pressure sensitive screens, acoustic pulse recognition touchscreens, or another presence-sensitive display technology.

UIC 14 may function as input devices using microphone or other transducer technologies, infrared sensor technologies, or other input device technology for use in receiving user input. For example, UIC 14 may detect, using built-in microphone technology, voice input. As another example, UIC 14 may include a presence-sensitive display that may receive tactile input from a user of computing device 2. UIC 14 may receive indications of tactile input by detecting one or more gestures from a user (e.g., the user touching or pointing to one or more locations of UIC 14 with a finger or a stylus pen).

UIC 14 may function as output (e.g., display) device and present output to a user. UIC 14 may function as an output device using any one or more display devices, such as liquid crystal displays (LCD), dot matrix displays, light emitting diode (LED) displays, organic light-emitting diode (OLED)

displays, e-ink, or similar monochrome or color displays capable of outputting visible information to a user of computing device 2. UIC 14 may function as output device using speaker technologies, haptic feedback technologies, or other output device technology for use in outputting information to a user. UIC 14 may present a user interface provided by application installer 26, application 10, or application 12. UIC 14 may present a user interface related to other features of computing platforms, operating systems, applications, and/or services executing at and/or accessible from computing device 2 (e.g., e-mail, chat, online services, telephone, gaming, etc.).

UI module 16 may manage user interactions with UIC 14 and other components of computing device 2. UI module 16 and UIC 14 may receive one or more indications of input (e.g., voice input, gesture input, etc.) from a user as the user interacts with the user interface, at different times and when the user and computing device 2 are at different locations. UI module 16 and UIC 14 may interpret inputs detected at UIC 14 and may relay information about the inputs detected at UIC 14 to application installer 26, application 10, application 12, and/or one or more other associated platforms, operating systems, applications, and/or services executing at computing device 2 to, for example, to cause computing device 2 to perform functions.

UI module 16 may cause UIC 14 to output, display, or otherwise present a user interface while a user of computing device 2 views output and/or provides input at UIC 14. For example, as shown in FIG. 1, UI module 16 may send instructions to UIC 14 that cause UIC 14 to display a graphical user interface (GUI), at a display screen of UIC 14. In other examples, UI module 16 may also cause UIC 14 to output a user interface in non-visual form, such as audio output. For example, if computing device 2 is an audio player device, UI module 16 may send instructions to UIC 14 that cause UIC 14 to output audio.

UI module 16 and UIC 14 may receive one or more indications of input (e.g., voice input, touch input, non-touch or presence-sensitive input, video input, audio input, etc.) from a user as the user interacts with the user interface output by UIC 14, at different times and when the user and computing device 2 are at different locations. UI module 16 and UIC 14 may interpret inputs detected at UIC 14 and may relay information about the inputs detected at UIC 14 to application installer 26, application 10, application 12, and/ or one or more other associated platforms, operating systems, applications, and/or services executing at computing device 2, for example, to cause computing device 2 to perform functions.

UI module 16 may also receive information and instructions from one or more associated platforms, operating systems, applications, and/or services executing at computing device 2 and/or one or more remote computing systems, such as application provider server 4. For example, UI module 16 may receive information (e.g., audio data, text data, image data, etc.) and instructions for presenting a user interface.

Applications 10 and 12 may be applications that are currently installed at computing device 2. While FIG. 1 illustrates two applications that are currently installed at computing device 2, it should be understood that any number of applications may be installed at computing device 2, and that computing device 2 is not necessarily limited to only having two applications be installed at computing device 2.

Applications that are installed at computing device 2 may include one or more application elements. Application elements of an application may include code that is used when executing the application. For example, application elements may include executable code and libraries that are executed by computing device 2 to execute the application, resources (e.g., images, textures, files, scripts, uncompiled code, etc.) that are accessed during execution of the application, and the like. It should be understood that the application elements of an application may not be accessible by other applications without explicit permission of the application containing the application elements. Thus, the application elements of an application do not include shared libraries or other data that is accessed by multiple different applications. As such, application 10 may not be able to access the application elements of application 12, and application 12 may not be able to access the application elements of application 10. In some examples, applications in computing device 2 may execute in a sandboxed environment, which isolates the application elements of an application from other applications.

Application 10 may include application elements 20A-20N ("application elements 20") that are stored at computing device 2, and application 12 may include application elements 22A-22M ("application elements 22") that are stored at computing device 2. In some examples, application elements 20 and 22 may each comprise one or more of four types of content: binary content, resources, managed code, and compiled resources. Binary content may refer to native code that is specific to the architecture of the one or more processors of computing device 2. For example, applications 10 and 12 may include native code for a variety of platforms including the computing device. Resources may include image content, audio content, video content, and the like. For example, while application 10 or application 12 executes at computing device 2, applications 10 or 12 may output such image content, audio content, and/or video content at UIC 14.

Compiled resources may be resources that are compiled, such as strings or extensible markup language (XML) files that are compiled into compiled resources. Managed code may be complied code that is not architecture-specific, and that can be executed by a virtual machine, such as compiled Java code, compiled Dalvik Executable code, and the like. In some examples, an application may include both managed code and native code as application elements. For example, the application may include one or more libraries that are written in native code, and may also include one or more other libraries that are written in managed code.

Application installer 26 may be executed by processors 36 to install and update applications at computing device 2. Application installer 26 may perform the functions of an application marketplace application that allows users to interact with application installer 26 via UIC 14 to browse, download, and install applications from an application provider server, such as application provider server 4. UIC 14 may receive input indicative of a request to install application 18 at computing device 2, and UI module 16 may forward to application installer 26 the request to install application 18 at computing device 2.

In accordance with aspects of the present disclosure, computing device 2 may download applications from application provider server 4 for installation at computing device 2 in a way that leverages application elements of applications that are currently installed at computing device 2. In the example of FIG. 1, in order to install application 18, application installer 26 may execute at computing device 2 to send a request to application provider 6 at application provider server 4 to download application 18 from application provider server 4 to computing device 2. When application installer 26 has received and/or obtained every application element of application elements 24A-240 ("application elements 24") of application, application installer 26 may install application 18 at computing device 2. Similar to application elements 20 and 22, application elements 24 may also include one or more of four types of content: binary content, resources, managed code, and compiled resources.

In response to receiving the request from computing device 2 to download an application to computing device 2, application provider 6 may determine whether one or more application elements of the application to be downloaded can be obtained from one or more applications that are already currently installed at computing device 2. Responsive to determining that one or more application elements of the application to be downloaded are available from one or more application that are already currently installed at computing device 2, application provider 6 may refrain from sending every application element of the application to computing device 2 when one or more of application elements of the application can be obtained from the one or more applications that are already currently installed at computing device 2. In this way, application provider 6 may refrain from sending every application element of the application to computing device 2 if one or more of application elements of the application can be obtained from the one or more applications that are already currently installed at computing device 2.

Application provider 6 may determine which applications are currently installed at computing device 2, and may also determine the application elements of the applications that are currently installed at computing device 2. For example, application provider 6 may access information stored at application provider server 4 regarding the applications that are currently installed at application 18, or may receive from computing device 2 indications of the applications that are currently installed at computing device 2. Application provider 6 may, based on such determinations, determine the one or more application elements of application elements 24 of application 18 that can be obtained from applications that are currently installed at computing device 2, and may determine whether it should refrain from transmitting those one or more application elements to computing device 2.

In situations in which the systems discussed here collect personal information about users, or may make use of personal information, the users may be provided with an opportunity to control whether programs or features collect user information (e.g., information about a user's social network, social actions or activities, profession, a user's preferences, or a user's current location), or to control whether and/or how to receive content from the content server that may be more relevant to the user. In addition, certain data may be treated in one or more ways before it is stored or used, so that personally identifiable information is removed. For example, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over how information is collected about the user and used by a content server.

In the example of FIG. 1, the user of computing device 2 may control the information regarding computing device 2 that is collected by application provider 6. For example, the user may control whether application provider 6 is able to receive and/or access information associated with computing device, such as the information regarding the applications that are currently installed at computing device 2. The user may also control the level of access that application provider 6 has to such information. In some instances, application provider 6 may be able to receive and/or access information regarding the applications that are currently installed at computing device 2 and/or to receive and/or access information associated with computing device 2 only after receiving explicit consent of the user of computing device 2.

In the example of FIG. 1, application provider 6 may determine whether one or more application elements of application elements 24 of application 18 can be obtained from applications 10 and 12 that are already currently installed at computing device 2. For example, application provider 6 may access information that indicates the one or more applications (e.g., applications 10 and 12) that are currently installed at computing device 2, as well as information that indicates the application elements of such applications that are currently installed at computing device 2. Such information may be stored at application provider server 4 or at another location (e.g., another remote server) that is accessible by application provider 6. Application provider 6 may read such information and may determine one or more application elements of application 18 that can be obtained from one or more applications that are already installed at computing device 2.

Application provider 6 may determine that an application element of application 18 can be obtained from an application that is already installed at computing device 2 if the application that is already installed at computing device 2 has an application element that is the same as the application element of application 18. For example, if an application element of application 18 is a library, and if the same version of that library already exists in an application that is already installed at computing device 2, application provider 6 may determine that the library can be obtained from the application that is already installed at computing device 2. In another example, if an application element of application 18 is a video file, and if the same video file already exists in an application that is already installed at computing device 2, application provider 6 may determine that the video file can be obtained from the application that is already installed at computing device 2.

Application provider 6 may also determine that an application element of application 18 can be obtained from an application that is already installed at computing device 2 when the application that is already installed at computing device 2 has an application element that can be modified, such as via a patch, to become an application element that is identical to the application element of application 18. For example, if an application element of application 18 is a up-to-date version of a library, and if an application element of an application that is already installed at computing device 2 contains an older version of the same library, computing device 2 may be able to obtain the up-to-date version of the library from the application that is already installed at computing device 2 by updating the older version of the library to the up-to-date version of the library. In this example, application provider 6 may generate a patch to update the older version of the library to the up-to-date version of the library, and may send the patch to computing device 2, so that computing device 2 may apply the patch to the older version of the library to update it to the up-to-date version of the library.

When application provider 6 determines that an application element of application elements 24 of application 18 can be obtained (or, in other words, is available) from an application that is already installed at computing device 2, application provider 6 may determine whether to request that computing device 2 obtain the application element from the application that is already installed at computing device 2, and to install application 18 using the obtained application element, or whether application provider 6 is to nonetheless send the application element of application elements 24 of application 18 to computing device 2. Application provider 6 may make the determination based at least in part on a variety of factors such as user sensitivity to download time, the network bandwidth available to computing device 2, the type of network connection that computing device 2 has, the available processing power of computing device 2, the remaining battery life of computing device 2, the location of computing device 2, and the like.

In some examples, application provider 6 may generate a profile of computing device 2 based on these and other factors to determine whether to direct computing device 2 to obtain the application element from the application that is already installed at computing device 2, and to install application 18 using the obtained application element, or whether application provider 6 is to nonetheless send the application element of application elements 24 of application 18 to computing device 2

For example, application provider 6 may send a request to computing device 2 to obtain application elements from applications that are already installed at computing device 2 if computing device 2 is connected to application provider 6 via a cellular data connection, and may send the application elements to computing device 2 if computing device 2 is connected to application provider 6 via Wi-Fi. In a further example, application provider 6 may send a request to computing device 2 to obtain application elements from applications that are already installed at computing device 2 if computing device 2 is connected to application provider 6 via a metered network connection, and may send the application elements to computing device 2 if computing device 2 is connected to application provider 6 via an unmetered network connection or a network connection with unlimited data. In another example, application provider 6 may determine the amount of network bandwidth that is available to computing device 2, and may send the application elements to computing device 2 if computing device 2's available network bandwidth is above a threshold.

In another example, if the amount of remaining battery life of the computing device 2 is less than a threshold, application provider 6 may send a request to computing device 2 to obtain application elements from applications that are already installed at computing device 2 if computing device 2 is connected to application provider 6 via a cellular data connection, and may send the application elements to computing device 2 if computing device 2 is connected to application provider 6 via Wi-Fi, because Wi-Fi may be relatively more power efficient than a cellular data connection.

When application provider 6 determines that computing device 2 is to obtain an application element from an application that is already installed at computing device 2, application provider 6 may send to computing device 2 a request to obtain the application element of application 18 from an application that is already installed at computing device 2. The request may identify the application element of application 18 that can be obtained from an application that is already installed at computing device 2, identify the application element of the application that is already installed at computing device 2, identify the location of the application element of the application that is already installed at computing device 2, and the like. If necessary, application provider 6 may also send a patch to computing device 2 that may be used to update the application element of the application that is already installed at computing device 2, so that the application element, as patched, is the same as an application element of application elements 24 of application 18.

In this way, application provider 6 may send to computing device 2, and computing device 2 may receive from application provide 6, indications of the one or more application elements of application 18 that can be obtained from applications that are already installed at computing device 2, along with one or more patches that computing device 2 may apply to one or more application elements of the applications that are already installed at computing device 2, in order to obtain the one or more application elements of application 18 from the applications that are already installed at computing device 2.

Computing device 2 may receive from application provider 6 one or more application elements of application 18. If application provider 6 determines that computing device 2 is to obtain one or more application elements from one or more of the applications that are already installed at computing device 2, then computing device 2 may also receive from application provider 6 a request to obtain one or more application elements of application 18 from one or more of the applications that are already installed at computing device 2.

The request received by computing device 2 may indicate the one or more application elements of the one or more applications that are already installed at computing device 2 that correspond to the one or more application elements of application 18 that are to be obtain from one or more of the applications that are already installed at computing device 2. An application element of an application that is already installed at computing device 2 may correspond to an application element of application 18 if computing device 2 can generate the application element of application 18 if computing device 2 from the application element of the application that is already installed at computing device 2, such as via making a copy of the corresponding application element or by applying a patch to the corresponding application element.

The request may include identifying information for each of the one or more application elements of the one or more applications that are already installed at computing device 2, such as the names or other identifying information associated with the one or more applications and/or the one or more application elements, the storage locations (e.g., directory path) of the one or more application elements in the storage devices included in or operably coupled to computing device 2, and the like.

The request may also specify how the one or more application elements of application 18 are to be obtained from the corresponding application elements of the one or more applications that are already installed at computing device 2. In one example, if a corresponding application element of the one or more applications that are already installed at computing device 2 is identical to an application element of application 18, the application element of application 18 can be obtained by making a copy of the corresponding application element, and by utilizing the copy of the corresponding application element as the application element of application 18.

In another example, if obtaining an application element of application 18 from a corresponding application element of the one or more applications that are already installed at computing device 2 includes patching the corresponding application element, computing device 2 may receive one or more patches from application provider 6 that computing device 2 may apply to the corresponding application element in order to obtain the application elements of application 18. Computing device 2 may apply the patch to the corresponding application element and may utilize the patched copy of the corresponding application element as the application element of application 18.

In the example of FIG. 1, application 18 that is to be installed at computing device 2 may include application elements 24. Application provider 6 may determine that application element 24A of application elements 24 cannot be obtained from the applications that are already installed at computing device 2 and, in response, application provider 6 may send application element 24A to computing device 2. Application provider 6 may further determine that application element 24B of application elements 24 can be obtained from application 12, and that application element 24C of application elements 24 can be obtained from application 10 by patching a corresponding application element of application 10. In response, application provider 6 may send to computing device 2 a request to obtain application element 24B is to from application 12, and a request to obtain application element 24C from application 10. Application provider 6 may also send to computing device 2 a patch to be applied to the corresponding application element of application 10 to obtain application element 24C

In response to sending the request to application provider 6 at application provider server 4 to download application 18 from application provider server 4, application installer 26 may receive application element 24A from application provider 6. Application installer 26 may also receive from application provider 6 the request to obtain application element 24B from application 12, and the request to obtain application element 24C from application 10. Application installer 26 may also receive a patch that is to be applied to a corresponding application element of application 10 to obtain application element 24C. Application installer 26 may use the requests in order to obtain application elements 24B and 24C from applications 10 and 12 that are installed at computing device 2, and may install application 18 using application elements 24A-24C.

The request to obtain application element 24B from application 12 may indicate that application element 22A of application 12 corresponds to application element 24B, such that application installer 26 may be able to generate application element 24B of application 18 based at least in part on application element 22A of application 12. The request may specify the location of application element 22A within a storage device included in or operably coupled to computing device 2, and may also specify how computing device 2 may be able to generate application element 24B from application element 22A.

In the example of FIG. 1, application element 22A may be identical to application element 24B, in that application element 22A and application element 24B may be the same version of the same library, be the same image file, be the same piece of executable code, include the same data, and the like. Thus, in response to receiving the indication that application element 24B is to be obtained from application 12, application installer 26 may generate application element 24B from application element 22A of application 12 by making a copy of application element 22A of application 12 and using the copy of application element 22A as application element 24B of application 18. For example, application installer 26 may store the copy of application element 22A in a storage location that is associated with application element 24B, set the permissions of the copy of application element 22A so that it may be accessible by executable code of application 18, and the like. In this way, application installer 26 may obtain application element 24B from application 12 and may use application element 24B to install application 18.

The request to obtain application element 24C from application 10 may indicate that application element 20A of application 10 corresponds to application element 24C, such that application installer 26 may be able to generate application element 24C of application 18 based at least in part on application element 20A of application 10. The request may specify the location of application element 20A within a storage device included in or operably coupled to computing device 2, and may also specify how application installer 26 may be able to generate application element 24C from application element 20A.

In the example of FIG. 1, application element 20A is not identical to application element 24C. For example, application element 20A may be an older version of a library and application element 24C may be a newer version of the same library. In this case, application installer 26 may apply a patch to application element 24C in order to generate application element 20A as the patched version of application element 24C.

In response to receiving the request to obtain application element 24C from application 10, and in response to receiving a patch that is used to obtain application element 24C, application installer 26 may generate application element 24C from application element 20A of application 10 by applying the patch to application element 20A of application and using the patched copy of application element 20A as application element 24C of application 18. For example, application installer 26 may store the patched copy of application element 20A in a storage location that is associated with application element 24C, set the permissions of the patched copy of application element 20A so that it may be accessible by executable code of application 18, and the like. In this way, application installer 26 2 may obtain application element 24C from application 10 and may use application element 24C to install application 18.

In response to receiving application element 24A from application provider 6, generating application element 24B from application element 22A of application 12, and generating application element 24C from application element 20A of application 10, application installer 26 may install application 18 using application elements 24A-24C. Application 18, as installed at computing device 2, may execute to perform one or more functions according to application elements 24 of application 18.

The techniques described in the context of FIG. 1 as well as throughout the disclosure may improve the functioning of computing system 1, computing device 2, and application provider server 4 in a number of ways. The techniques of the disclosure reduce the amount of data that is sent from application provider server 4 and computing device 2, thereby reducing the bandwidth consumption of application provider server 4 and computing device 2. Further, by reducing the amount of data that is sent from application provider server 4 and computing device 2 in order to install application 18 at computing device 2, computing device 2 may reduce the amount of time spent by computing device 2 to receive application elements of application 18 from computing device 2, thereby reducing the amount of time required by computing device 2 to install application 18.

The techniques described herein may also improve the functioning of the computing device 2 itself by minimizing the impact that installing application 18 has on the battery life and/or processing capabilities of computing device 2. By determining whether to send one or more applications elements from application provider server 4 to computing device 2 or whether to obtain the one or more application elements from an application that is already installed at computing device 2 based at least in part on the type of network connection established by computing device 2, the available bandwidth of the network connection established by computing device 2, the current processor and/or memory load of computing device 2, and/or the remaining battery life of computing device 2, the techniques described herein may adaptively install application 18 at computing device 2 in a way that minimizes the impact that installing application 18 has on the battery life and/or processing capabilities of computing device 2.

Figure 2:
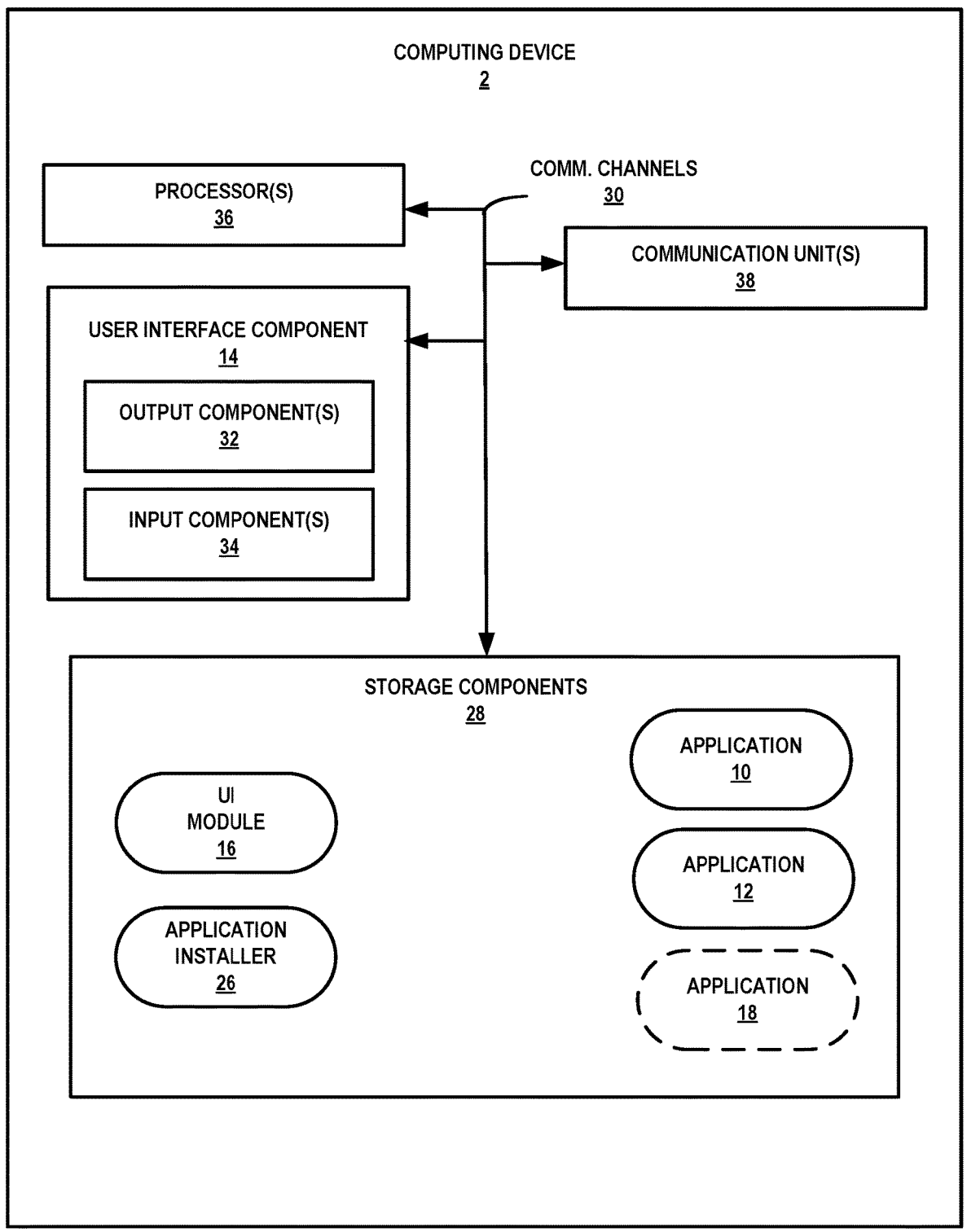
FIG. 2 is a block diagram illustrating an example computing device that is configured to install one or more applications by leveraging the application elements of applications that are already installed at the computing device, in accordance with one or more aspects of the present disclosure.

FIG. 2 is a block diagram illustrating an example computing device that is configured to install one or more applications by leveraging the application elements of applications that are already installed at the computing device, in accordance with one or more aspects of the present disclosure. FIG. 2 illustrates only one particular example of computing device 2, and many other examples of computing device 2 may be used in other instances and may include a subset of the components included in example computing device 2 or may include additional components not shown in FIG. 2.

As shown in the example of FIG. 2, computing device 2 includes user interface component (UIC) 14, one or more processors 36, one or more communication units 38, and one or more storage components 28. UIC 14 includes output component 32 and input component 34. Storage components 28 of computing device 2 include UI module 16, application installer 26, and applications 10 12, and 18.

Communication channels 30 may interconnect each of the components 14, 36, 38, and 28 for inter-component communications (physically, communicatively, and/or operatively). In some examples, communication channels 30 may include a system bus, a network connection, an inter-process communication data structure, or any other method for communicating data.

One or more communication units 38 of computing device 2 may communicate with external devices (e.g., application provider server 4) via one or more wired and/or wireless networks (e.g., network 8) by transmitting and/or receiving network signals on the one or more networks. Examples of communication units 38 include a network interface card (e.g. such as an Ethernet card), an optical transceiver, a radio frequency transceiver, a global positioning satellite (GPS) receiver, or any other type of device that can send and/or receive information. Other examples of communication units 38 may include short wave radios, cellular data radios, wireless network radios, as well as universal serial bus (USB) controllers.

One or more input components 34 of computing device 2 may receive input. Examples of input are tactile, audio, and video input. Input components 34 of computing device 2, in one example, includes a presence-sensitive input device (e.g., a touch sensitive screen, a PSD), mouse, keyboard, voice responsive system, video camera, microphone or any other type of device for detecting input from a human or machine. In some examples, input components 34 may include one or more sensor components one or more location sensors (GPS components, Wi-Fi components, cellular components), one or more temperature sensors, one or more movement sensors (e.g., accelerometers, gyros), one or more pressure sensors (e.g., barometer), one or more ambient light sensors, and one or more other sensors (e.g., microphone, camera, infrared proximity sensor, hygrometer, and the like). Other sensors may include a heart rate sensor, magnetometer, glucose sensor, hygrometer sensor, olfactory sensor, compass sensor, step counter sensor, to name a few other non-limiting examples.

One or more output components 32 of computing device 2 may generate output. Examples of output are tactile, audio, and video output. Output components 32 of computing device 2, in one example, includes a PSD, sound card, video graphics adapter card, speaker, cathode ray tube (CRT) monitor, liquid crystal display (LCD), or any other type of device for generating output to a human or machine.

UIC 14 may include output component 32 and input component 34. Output component 32 may be a display component, such as a screen at which information is displayed by UIC 14 and input component 34 may be a presence-sensitive input component that detects an object at and/or near output component 32. Output component 32 and input component 34 may be a speaker and microphone pair or any other combination of one or more input and output components, such as input components 34 and output components 32. In the example of FIG. 2, UIC 14 may present a user interface.

While illustrated as an internal component of computing device 2, UIC 14 may also represent an external component that shares a data path with computing device 2 for transmitting and/or receiving input and output. For instance, in one example, UIC 14 represents a built-in component of computing device 2 located within and physically connected to the external packaging of computing device 2 (e.g., a screen on a mobile phone). In another example, UIC 14 represents an external component of computing device 2 located outside and physically separated from the packaging or housing of computing device 2 (e.g., a monitor, a projector, etc. that shares a wired and/or wireless data path with computing device 2).

One or more storage components 28 within computing device 2 may store information for processing during operation of computing device 2 (e.g., computing device 2 may store data accessed by UI module 16, application installer 26, and applications 10, 12, and 18 during execution at computing device 2). In some examples, storage component 28 is a temporary memory, meaning that a primary purpose of storage component 28 is not long-term storage. Storage components 28 on computing device 2 may be configured for short-term storage of information as volatile memory and therefore not retain stored contents if powered off. Examples of volatile memories include random access memories (RAM), dynamic random access memories (DRAM), static random access memories (SRAM), and other forms of volatile memories known in the art.

Storage components 28, in some examples, also include one or more computer-readable storage media. Storage components 28 in some examples include one or more non-transitory computer-readable storage mediums. Storage components 28 may be configured to store larger amounts of information than typically stored by volatile memory. Storage components 28 may further be configured for long-term storage of information as non-volatile memory space and retain information after power on/off cycles. Examples of non-volatile memories include magnetic hard discs, optical discs, floppy discs, flash memories, or forms of electrically programmable memories (EPROM) or electrically erasable and programmable (EEPROM) memories. Storage components 28 may store program instructions and/or information (e.g., data) associated with UI module 16, application installer 26, and applications 10, 12, and 18. Storage components 28 may include a memory configured to store data or other information associated with UI module 16, application installer 26, and applications 10, 12 and 18.

One or more processors 36 may implement functionality and/or execute instructions associated with computing device 2. Examples of processors 36 include application processors, display controllers, auxiliary processors, one or more sensor hubs, and any other hardware configure to function as a processor, a processing unit, or a processing device. UI module 16, application installer 26, and applications 10, 12 and 18 may be operable by processors 36 to perform various actions, operations, or functions of computing device 2. For example, processors 36 of computing device 2 may retrieve and execute instructions stored by storage components 28 that cause processors 36 to perform the operations of UI module 16, application installer 26, and applications 10, 12 and 18. The instructions, when executed by processors 36, may cause computing device 2 to store information within storage components 28.

UI module 16 may manage user interactions with UIC 14 and other components of computing device 2. UI module 16 may cause UIC 14 to output a user interface as a user of computing device 2 views output and/or provides input at UIC 14.

Applications 10 and 12 are applications that are already installed at computing device 2, and may be executed by processors 36 to perform various functions.

Application installer 26 may be executed by processors 36 to install and update applications at computing device 2. Application installer 26 may perform the functions of an application marketplace application that allows users to interact with application installer 26 via UIC 14 to browse, download, and install applications from an application provider server, such as application provider server 4. UIC 14 may receive input indicative of a request to install application 18 at computing device 2, and UI module 16 may forward to application installer 26 the request to install application 18 at computing device 2.

In response to receiving the request to install application 18 at computing device 2, application installer may send, via communication units 38, a request for application 18 to application provider 6 at application provider server 4. The request may include information that may be used by application provider 6 to determine how application elements of application 18 are sent to computing device 2. For example, such information may include the current location (e.g., geographical location) of computing device 2, the type of network connection established by communication units 38, the available bandwidth of the network connection established by communication units 38, the current processor and/or memory load of processors 36, the remaining battery life of computing device 2, user preferences regarding the download of application 18, the applications that are currently installed at computing device 2, the application elements of the applications that are currently installed at computing device 2, and the like.

In response to sending the request for application 18 to application provider 6, application installer 26 may receive from application provider 6 a first one or more application elements of application 18. Application installer 26 may receive the first one or more application elements of application 18 in a compressed form in order to reduce the amount of time required to download the first one or more application elements.

Each application element of the first one or more application elements may have been compressed (e.g., by application provider server 4) using a compression algorithm that is specific to the application element type of the application element, to reduce the size of the first one or more application elements that are transmitted via a network to computing device 2. Thus, if the first one or more application elements of application 18 includes two or more application elements of two or more application element types, each of the two or more types of application elements of the two or more application elements may have been compressed using a different compression algorithm. To aid in decompressing application elements received from application provider 6, computing device may store compression dictionaries in storage components 28 for application elements that have been compressed using a dictionary-based compression algorithm in which a block of data, such as a string, can be replaced by reference to the position of the block of data in the compression dictionaries. The compression dictionaries can include an index of blocks of data which the dictionary-based compression algorithm may index into in order to compress and decompress data. To decompress application elements that have been compressed using a dictionary-based compression algorithm, application installer 26 may substitute the references in the compressed graphics elements with blocks of data at the corresponding referenced locations in the compression dictionaries.

Application installer 26 may not receive every one of the plurality of application elements of application 18 from application provider 6. Instead, application installer may receive a request to obtain a second one or more application elements of application 18 from one or more applications that are already installed at computing device 2. The request may identify one or more corresponding application elements of applications that are already installed at computing device 2 that correspond to the second one or more application elements of application 18, so that application installer 26 may obtain the second one or more application elements by copying or patching the corresponding one or more application elements of applications that are already installed at computing device 2. For example, the request may include an indication of the locations of the one or more corresponding application elements in storage components 28, an indication of unique identifiers of the one or more corresponding application elements, and the like, that may enable computing device 2 to identify the one or more corresponding application elements out of the application elements of the applications that are already installed at computing device 2.

In some examples, the request to obtain the second one or more application elements of application 18 from one or more applications that are already installed at computing device 2 may include one or more patches that application installer 26 may apply to the corresponding one or more application elements of the applications that are already installed at computing device 2. Application installer 26 may apply the one or more patches to the corresponding one or more application elements of the applications that are already installed at computing device 2 and may use the patched corresponding one or more application elements of the applications that are already installed at computing device 2 as the second one or more application elements of application 18.

Once application installer 26 has received or obtained every application element of application 18, including the first and second application elements, application installer 26 may install application 18 using the application elements of application 18. Installing application 18 may include creating a package for application 18 in which application elements of application 18 are stored within the package in a way that the package represents an application that computing device 2 can execute to perform one or more functions.

Figure 3:
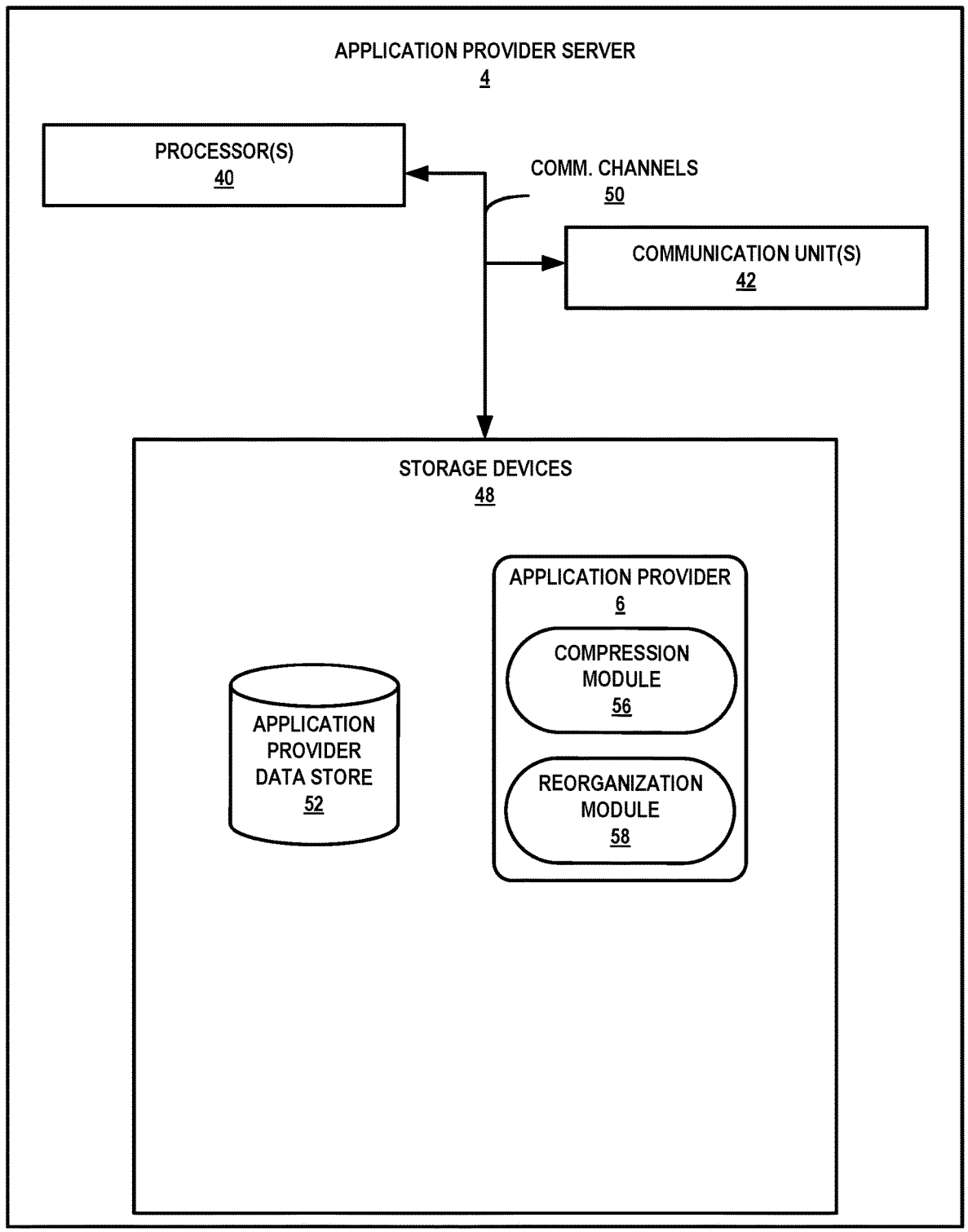
FIG. 3 is a block diagram illustrating an example application provider server, in accordance with one or more aspects of the present disclosure.

FIG. 3 is a block diagram illustrating an example application provider server, in accordance with one or more aspects of the present disclosure. FIG. 3 illustrates only one particular example of application provider server 4, and many other examples of application provider server 4 may be used in other instances. In other examples, application provider servers may include a subset of the components included in example application provider server 4 or may include additional components not shown in FIG. 3. For example, application provider server 4 may comprise a cluster of servers, and each of the servers comprising the cluster of servers making up application provider server 4 may include all, or some, of the components described herein in FIG. 3, to perform the techniques disclosed herein.

As shown in the example of FIG. 3, application provider server 4 includes one or more processors 40, one or more communication units 42, and one or more storage devices 48. Storage devices 48 include application provider 6 and application provider data store 52.

Processors 40 are analogous to processors 36 of computing device 2 of FIG. 2. Communication units 42 are analogous to communication units 38 of computing device 2 of FIG. 2. Storage devices 48 are analogous to storage components 28 of computing device 2 of FIG. 2. Communication channels 50 are analogous to communication channels 30 of computing device 2 of FIG. 2 and may therefore interconnect each of the components 40, 42, and 48 for inter-component communications. In some examples, communication channels 50 may include a system bus, a network connection, an inter-process communication data structure, or any other method for communicating data.

In some examples, storage devices 48 is a temporary memory, meaning that a primary purpose of storage devices 44 is not long-term storage. In this example, storage devices 48 may be configured for short-term storage of information as volatile memory and therefore not retain stored contents if powered off. Examples of volatile memories include random access memories (RAM), dynamic random access memories (DRAM), static random access memories (SRAM), and other forms of volatile memories known in the art.

In some examples, storage devices 48 may also include one or more computer-readable storage media. Storage devices 48 in some examples include one or more non-transitory computer-readable storage mediums. Storage devices 48 may be configured to store larger amounts of information than typically stored by volatile memory. Storage devices 48 may further be configured for long-term storage of information as non-volatile memory space and retain information after power on/off cycles. Examples of non-volatile memories include magnetic hard discs, optical discs, floppy discs, flash memories, or forms of electrically programmable memories (EPROM) or electrically erasable and programmable (EEPROM) memories. Storage devices 48 may store program instructions and/or information (e.g., data) associated with application provider 6 and application provider data store 52. Storage devices 48 may include a memory configured to store data or other information associated with application provider 6 and application provider data store 52.

Application provider data store 52 may be configured to store information received by, created by, and/or otherwise associated with application provider 6. For example, application provider data store 52 may store applications that may be downloaded from application provider server for installation at a computing device, such as computing device 2. Such applications may be uploaded by application developers to application provider server 4, so that the applications may be available for download by application provider 6 to computing devices.

Application provider data store 52 may also store information regarding the applications that are installed at computing devices that communicate with application provider server 4. For example, for computing device 2, application provider data store 52 may store indications of the applications that are installed at computing device 2, the versions of the applications that are installed at computing device 2, the application elements making up the applications that are installed at computing device 2, applications that were previously installed at computing device 2 but are no longer installed at computing device 2, and the like.

Application provider 6 may execute at processors 40 and may be configured to send applications and patches to computing devices in order to install applications at the computing devices and/or update applications that are installed at the computing devices. Application provider 6 may receive a request for an application from a computing device and may, in response to receiving the request from a computing device, send one or more application elements of the requested application to the requesting computing device.

Instead of sending all of the application elements of the requested application, application provider 6 may determine whether one or more application elements of the application can be obtained from one or more applications that are already currently installed at the computing device. If so, application provider 6 may direct the computing device to obtain such one or more application elements from the one or more applications that are already currently installed at the computing device and may refrain from sending such one or more application elements to the computing device.

Application provider data store 52 may store indications of applications that are currently installed at computing devices that communicate with application provider server 4. For example, when application provider 6 receives a request for an application from a computing device, application provider server 4 may update the application provider data store 52 to include an indication that the requested application is installed at the computing device. In addition, when applications are deleted or otherwise uninstalled from a computing device, application provider server 4 may receive an indication of the application being deleted or uninstalled from the computing device, and may update the application provider data store 52 to include an indication that the application is no longer installed at the computing device. In this way, application provider data store 52 may store indications of applications that are currently installed at computing devices that communicate with application provider server 4.

Application provider 6 may, based on the information stored in application provider data store 52, determine one or more application elements of the requested application that can be obtained from applications that are currently installed at the requesting computing device. An application element of the requested application can be obtained from applications that are currently installed at the requesting computing device if 1) the applications that are currently installed at the requesting computing device includes the same application element as the application element of the requested application, or 2) the applications that are currently installed at the requesting computing device includes an application element that can be patched to be the same as the application element of the requested application. For example, if the application element of the requested application is a library, the application element may be obtained from applications that are currently installed at the requesting computing device if the applications include the same version of the library, or an older version of the library that can be updated via a patch to the same version of the library.

When application provider 6 determines that one or more application elements of the requested application can be obtained from applications that are currently installed at the requesting computing device, application provider 6 may determine to refrain from sending the one or more application elements of the requested application to the requesting computing device, and to instead direct the requesting computing device to obtain the one or more application elements of the requested application from applications that are currently installed at the requesting computing device. In other situations, application provider 6 may send the one or more application elements of the requested application to the requesting computing device even when the one or more application elements of the requested application can be obtained from applications that are currently installed at the requesting computing device.

Application provider 6 may determine whether to send one or more application elements of the requested application to the requesting computing device even when the one or more application elements of the requested application can be obtained from applications that are currently installed at the requesting computing device based on a variety of factors. Such factors may include user sensitivity to the amount of time for installing the requested application, characteristics of the network connection of the requesting computing device, the available bandwidth of the network connection of the requesting computing device, the type of the network connection of the requesting computing device, the location of the computing device, the processor and/or memory utilization of any patches to be applied by the requesting computing device to obtain the one or more application elements, the remaining battery life of the computing device, and the like. Application provider server 4 may receive indications of such factors from the requesting computing device, and may store such information in application provider data store 52. Application provider 6 may generate a profile of the requesting computing device based on these and other factors to determine whether to send the one or more application elements of the requested application to the requesting computing device.

In some examples, application provider 6 may refrain from sending the one or more application elements of the requested application to the requesting computing device if computing device 2 is connected to application provider 6 via a cellular data connection instead of Wi-Fi, and may send the one or more application elements of the requested application to the requesting computing device if the requesting device is connected to application provider 6 via Wi-Fi.

In some examples, application provider 6 may refrain from sending the one or more application elements of the requested application to the requesting computing device if the requesting computing device is connected to application provider 6 via a metered network connection, and may send the one or more application elements of the requested application to the requesting computing device if the requesting device is connected to application provider 6 via an unmetered network connection or a network connection with unlimited data. In another example, application provider 6 may determine the amount of network bandwidth that is available to the requesting computing device, and may send the one or more application elements of the requested application to the requesting computing device if the requesting computing device's available network bandwidth is above a threshold.

In some examples, when obtaining the one or more application elements of the requested application from applications that are currently installed at the requesting computing device includes applying a patch to application elements of the currently-installed applications, application provider 6 may determine the processor and/or memory utilization of the patches to be applied by the requesting computing device to the application elements of the currently-installed application, as well as the current processor and/or memory utilization of the requesting computing device and the remaining battery life of the requesting computing device. Because applying a patch to application elements of the currently-installed applications may potentially be processor-intensive and memory-intensive, and may potentially drain the battery of the requesting computing device, application provider 6 may determine whether the requesting computing device has the available resources to apply the patch in a way that is faster than downloading the one or more application elements of the requested application from the application provider server 4.

Application provider 6 may send to the requesting device a first one or more application elements of the requested application, and may also send to the requesting device an indication of a second one or more application elements of the requested application that are to be obtained from applications that are already installed at the requesting device. The indication may identify the second one or more application elements of the requested application, and may also identify the corresponding application elements of the applications that are already installed at the requesting computing device from which the requesting device may obtain the second one or more application elements of the requested application. If necessary, application provider 6 may also send one or more patches to the requesting computing device that may be used to update the one or more application elements of the applications that are already installed at computing device 2 in order to obtain the second one or more application elements of the requested application.

In accordance with aspects of the present disclosure, to further reduce the amount of data that is sent from application provider server 4 and a computing device (e.g., computing device 2) to send one or more application elements to the computing device to install or update an application at the computing device, application provider server 4 may compress application elements that are sent from application provider server 4 to the computing device. In particular, compression module 56 may execute at processors 40 to apply different compression techniques to different types of application elements, and may tune parameters of the compression techniques used for application elements of the same type based on the content of the application elements. In this way, compression module 56 may be able to better compress different application elements of different types compared with applying a single compression technique to compress different application elements of different types.

Compression module 56 may determine the compression techniques to be applied to application elements based at least in part on the type of the application elements that compression module 56 is to compress. Thus, when compression module 56 encounters a plurality of application elements that includes at least a first application element of a first type and a second application element of a second type that is different from the first type, compression module may apply a first compression technique to the first application element of a first type, and may apply a second compression technique different from the first compression technique to the second application element of the second type. In this way, compression module 56 may, for each of a plurality of different types of application elements, apply a different compression technique to compress each of the plurality of different types of application elements.

As discussed previously, an application may include multiple application elements of different application element types. For example, an application may include one or more application elements that are binary content containing native code that is architecture specific. To compress application elements of this type, compression module 56 may use a compression technique that is optimized for compressing native code, such as compression techniques that align code at a per-CPU instruction level, compared with compression techniques that treat the native code as an arbitrary blob of garbled text.

An application may also include one or more application elements that are resources such as images, audio files, video files, and the like. For application elements of this type, compression module 56 may rely on the existing compression provided by the native file formats of the images, audio files, video files, and the like. In this case, compression module 56 may not necessarily further compress such application elements.

An application may also include one or more application elements that are managed code. Managed code may be executable code that is executed under the management of a virtual machine, such as compiled Java code, compiled Dalvik Executable code, and the like. For application elements of this type, compression module 56 may use a compression technique that is optimized for compressing the managed code. For example, such a compression technique may tune a dictionary-based compression algorithm for common phrases in the compiled Java code or the compiled Dalvik Executable code.

Application provider data store 52 may store compression dictionaries for compression techniques that uses a dictionary-based compression algorithm in which a block of data, such as a string, can be replaced by reference to the position of the block of data in the compression dictionaries. The compression dictionaries can include an index of blocks of data which the dictionary-based compression algorithm may index into in order to compress and decompress data.

In accordance with aspects of the present disclosure, to further reduce the amount of data that is sent from application provider server 4 and a computing device (e.g., computing device 2) to send one or more application elements to the computing device, application provider server 4 may transform application elements of an application to reduce the size of patches that may be applied to update previous or older versions of the application elements. For example, application provider 6 may reorganize the code of a new version of a library to reduce the size of a patch that is used to update previous versions of the library to the new version of the library.

Such reorganization may be helpful for application elements that are managed code. For managed code, small changes to the output code generated by compilers may result in large differences in the arguments created by offsets. Thus, the size of a patch for patching managed code may be relatively large compared with the size of the managed code, even for incremental changes to the managed code.

A patch for updating a previous version of an application element to an updated version of the application element is a compact encoding of the differences between the updated version of the application element and the previous version of the application element. The larger the size of the patch, the longer it may take to download and apply the patch. By reducing the size of patches, application provider 6 may decrease the amount of time it takes to download the patch from application provider server 4, and may also decrease the processing needed at the computing device to apply the patch.

Application provider 6 may include reorganization module 58 that executes at processors 40 to reorganize the code of one or more application elements based on previous versions of the one or more application elements, in order to reduce the size of patches that are used to patch the previous versions of the one or more application elements to update them to the one or more application elements. For example, when application provider 6 receives an upload of a new version of an application element, application provider 6 may reorganize the code within the new version of the application element based on previous version of the application element to reduce the size of a patch that can be applied to update the previous version of the application element to the new version of the application element. Application provider 6 may generate the patch based at least in part on the difference between the new version of the application element containing the reorganized code and the previous version of the application element.

For application elements that include code files, such as in the case of managed code or native code, reorganization module 58 can reduce the size of patches that patch a previous version of an application element to a new version of an application element by maximizing the number of contiguous blocks in the code of the new version of the application element that has a matching contiguous block in the code of the previous version of the application element. The contiguous blocks in the new version of the application element that has a matching contiguous block in the previous version of the application element may be referred to as shared contiguous blocks. The greater the number of matching contiguous blocks, the fewer substitutions may be encoded in the patch, thereby reducing the size of the patch.

In order to reorganize a new version of an application element, reorganization module 58 may obtain a profile of a previous version of the application element that is to be patched. In some examples, application provider 6 may perform profiling of the previous version of the application element. In other examples, application provider 6 may receive the profile of the previous version of the application element from another computing device.

The profile for an application element may include information derived from the application element that describe the code (e.g., managed code) in the application elements, such as the methods, constants, classes, and the like that are in the code, the ordering of the methods, constants, and classes in the code. When an application element includes more than one code file, each code file may have an associated profile that describes the code within the code file.

Reorganization module 58 may use the profile of the previous version of the application element to reorganize a new version of the application element. Reorganization module 58 may find all of the methods, constants, and classes in the one or more code files included in the new version of the application element that corresponds to the methods, constants, and classes in the previous version of the application element, as indicated by the profile. Reorganization module 58 may reorganize the code files by grouping such methods, constants, and classes together in a code file in the new version of the application element, or in a newly created code file in the new version of the application element. Reorganization module 58 may also rearrange the ordering of the methods, constants, and classes that are group together so that they match the ordering of methods, constants, and classes in the profile. Reorganization module 58 may adjust all internal references in the code files of the new version of the application element to the methods, constants, and classes to account for their new positions within the code files. If necessary, application provider 6 may re-sign the binary making up the new version of the application element.

In some examples, reorganizing the code files of a new version of the application element according to the techniques described above may increase the number of code files in the application element. For example, reorganization module 58 may split a single code file into a plurality of code files in the new version of the application element, where each code file is each associated with a single profile.

Reorganizing the code files of a new version of the application element according to the techniques described above may increase the number and the size of contiguous regions in the new version of the application element that match contiguous regions in the previous version of the application element. By increasing the number and size of matching contiguous regions, the techniques described above reduces the size of the patches that are used to update the previous version of the application element to the new version of the application element.

Figure 4:
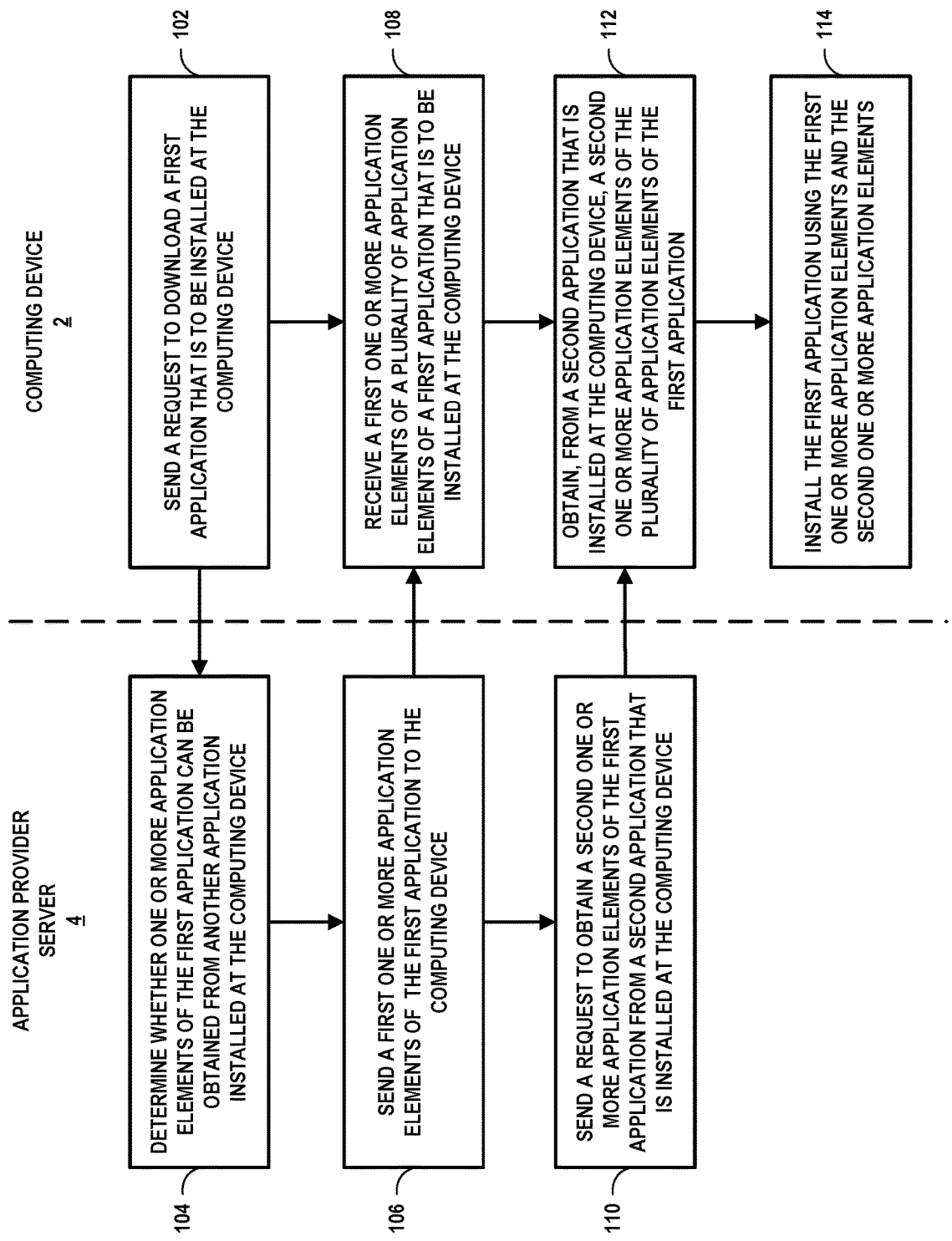
FIG. 4 is a flowchart illustrating example operations performed by a computing system that includes one or more processors executing at a computing device and one or more processors executing at an application provider server, in accordance with one or more aspects of the present disclosure.

FIG. 4 is a flowchart illustrating example operations performed by a computing system that includes one or more processors executing at a computing device and one or more processors executing at an application provider server, in accordance with one or more aspects of the present disclosure. As shown in FIG. 4, operations 102, 108, 112, and 114 are described below in the context of computing device 2 shown in FIGS. 1 and 2, and operations 104, 106, and 110 are described below in the context of application provider server 4 shown in FIGS. 1 and 3.

For example, application installer shown in FIGS. 1 and 2 may execute at one or more processors of computing device 2 to perform operations 102, 108, 112, and 114, in accordance with one or more aspects of the present disclosure. Application provider 6 shown in FIGS. 1 and 3 may execute at one or more processors of application provider server 4 to perform operations 104, 106, and 110, in accordance with one or more aspects of the present disclosure.

In operation, computing device 2 may send a request to application provider server 4 to download a first application 18 that is to be installed at computing device 2 (102). For example, the request may include an identifier for application 18 that enables computing device 2 to identify the first application 18 out of the applications stored at application provider server 4.

In response to receiving the request from computing device 2, application provider server 4 may determine whether one or more application elements of the first application 18 can be obtained from another application that is already installed at computing device 2 (104). If application provider server 4 determines that one or more application elements of the first application 18 can be obtained from another application that is already installed at computing device 2, application provider server 4 may refrain from sending the one or more application elements of the first application 18 to computing device 2, and may instead send to computing device 2 a request to obtain the one or more elements of the first application 18 from another application that is installed at computing device 2.

For application elements of the first application 18 that can be obtained from another application that is installed at computing device 2, application provider server 4 may determine whether to send the one or more elements to the computing device, or whether to refrain from sending the one or more elements to the computing device and instead send a request to the computing device to obtain the one or more elements from another application that is installed at computing device 2 based at least in part on one or more of: user sensitivity to an amount of time for installing the first application 18, a type of a network connection of computing device 2, available bandwidth of the network connection of computing device 2, a location of computing device 2, a remaining battery life of the computing device 2, processor characteristics of the computing device 2, and memory characteristics of computing device 2.

If a first one or more application elements of the first application 18 cannot be obtained from another application that is installed at computing device 2, or if application provider server 4 determines that it will send the first one or more elements of the first application 18 to computing device 2 based on one or more of the factors listed above, application provider server 4 may send the first one or more application elements of the first application 18 to computing device 2 (106).

Sending the first one or more application elements of the first application 18 to computing device 2 may include compressing each of the one or more application elements of the first application 18. Application provider server 4 may apply a different compression algorithm to each different application element type to compress the first one or more application elements. Thus, if the one or more application elements includes two or more application elements of two or more application element types, application provider server 4 may apply a first compression algorithm to a first application element of a first application element type of the two or more application elements, and may apply a second compression algorithm different from the first compression algorithm to a second application element of a second application element type of the two or more application elements.

Computing device may receive the first one or more application elements of the first application 18 (108) and may decompress the first one or more application elements.

Application provider server 4 may refrain from sending a second one or more application elements of the first application 18 to computing device 2. Instead, application provider server 4 may send a request to computing device 2 to obtain the second one or more application elements of the first application 18 from a second application that is installed at computing device 2 (110). The request may indicate a location in computing device 2 of a corresponding one or more application elements of the second application from which computing device 2 may generate the second one or more application elements of the first application 18.

In some examples, the request may include a patch that computing device 2 may apply to the corresponding application element of the second application to generate the second one or more application elements of the first application 18. To reduce the size of the patch that is sent to application 18, application provider server 4 may reorganize code in the second one or more application elements of application 18 to increase the number of contiguous blocks in the code that match contiguous blocks in the corresponding one or more application elements of the second application already installed at computing device 2.

Computing device 2 may receive the request to obtain the second one or more application elements of the first application 18 from a second application that is installed at computing device 2, and may obtain the second one or more application elements of the first application 18 from the second application that is installed at computing device 2 based at least in part on the request (112). Computing device 2 may access the corresponding application element of the second application and may obtain the second one or more application elements by making a copy of the corresponding application element or by applying the patch received from application provider server 4 to generate the second one or more application elements.

Computing device 2 may install the first application 18 using the first one or more application elements and the second one or more application elements (114).

Figure 5:
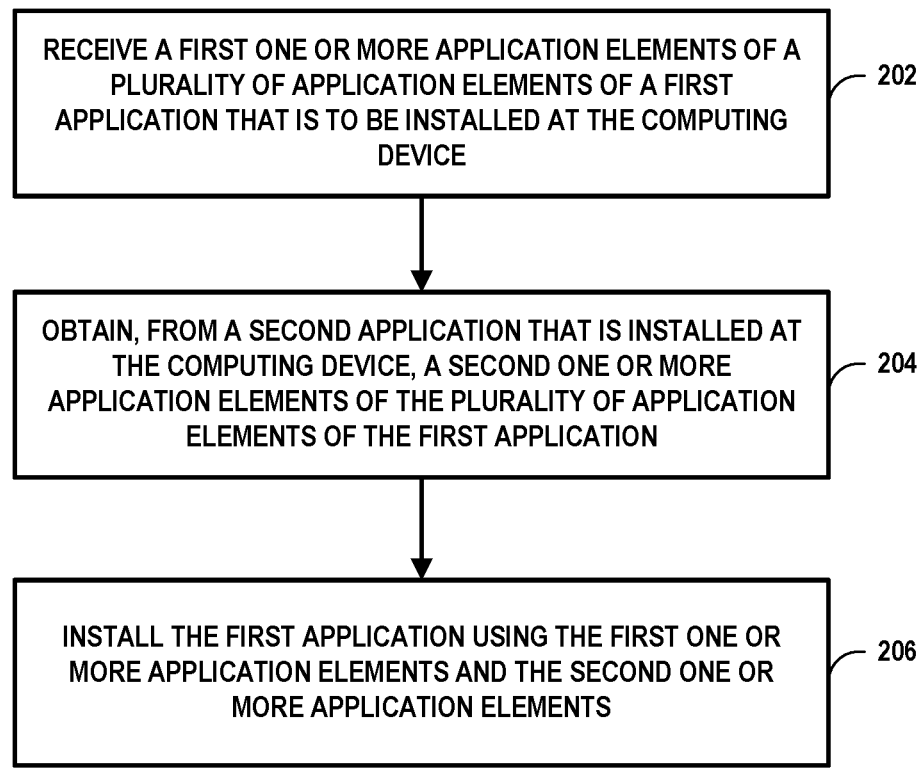
FIG. 5 is a flowchart illustrating example operations performed by one or more processors executing at a computing device, in accordance with one or more aspects of the present disclosure.

FIG. 5 is a flowchart illustrating example operations performed by one or more processors executing at a computing device, in accordance with one or more aspects of the present disclosure. As shown in FIG. 5, computing device 2 may receive, from an external computing device 4, a first one or more application elements of a plurality of application elements of a first application 18 that is to be installed at the computing device 2 (202). Computing device 2 may further obtain, from a second application that is installed at the computing device 2, a second one or more application elements of the plurality of application elements of the first application 18 that is to be installed at the computing device 2 (204). Computing device 2 may further install, using the first one or more application elements and the second one or more application elements, the first application 18 at the computing device 2 (206).

In some examples, computing device 2 may further receive, from the external computing device 4, an indication of one or more application elements of the second application that are to be used to install the first application 18, and computing device 2 may further generate, the second one or more application elements based at least in part on the one or more application elements of the second application. In some examples, generating the second one or more application elements based at least in part on the one or more application elements of the second application may include retrieving a copy of one or more application elements of the second application for use as the second one or more application elements of the first application 18.

In some examples, generating the second one or more application elements based at least in part on the one or more application elements of the second application may include applying a patch received from the external computing device 4 to the one or more application elements of the second application to generate an updated version of the one or more application elements, and using the updated version of the one or more application elements as the second one or more application elements of the first application 18.

In some examples, the second one or more application elements comprise a first version of a library, the one or more application elements of the second application comprises a second version of the library that is a previous version of the library, and applying the patch received from the external computing device 4 to the one or more application elements of the second application includes applying the patch to the one or more application elements of the second application to update the second version of the library to the first version of the library.

In some examples, the computing device 2 may further obtain, from a third application that is installed at the computing device 2, a third one or more application elements of the plurality of application elements of the first application 18 that is to be installed at the computing device 2, wherein the computing device 2 may further use the third one or more application elements to install the first application 18 at the computing device 2.

In some examples, the plurality of application elements of the first application 18 may include one or more of: managed code, native code, resources, and compiled resources.

In some examples, the one or more application elements received from the external computing device 4 includes two or more types of application elements, and each of the two or more types of application elements are compressed using a different compression algorithm.

Figure 6:
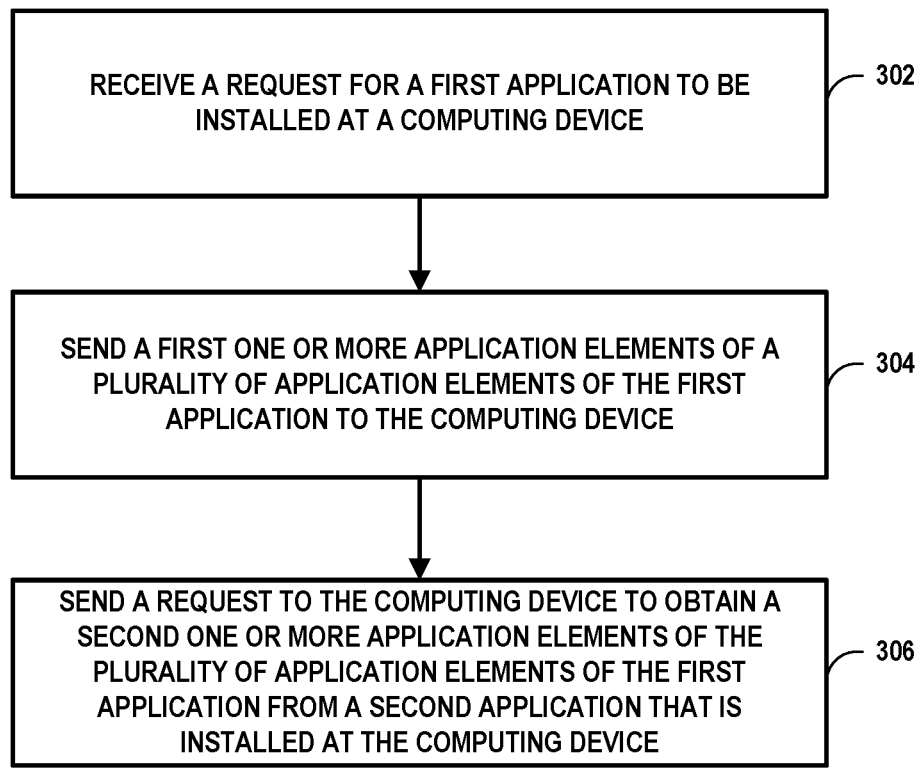
FIG. 6 is a flowchart illustrating example operations performed by one or more processors executing at an application provider server, in accordance with one or more aspects of the present disclosure.

FIG. 6 is a flowchart illustrating example operations performed by one or more processors executing at an application provider server, in accordance with one or more aspects of the present disclosure. As shown in FIG. 6, application provider server 4 may receive, from computing device 2, a request for a first application 18 that is to be installed at computing device 2 (302). Application provider server 4 may send a first one or more application elements of a plurality of application elements of the first application 18 to computing device (304). Application provider server 4 may also send a request to computing device 2 to obtain a second one or more application elements of the plurality of application elements of the first application from a second application that is installed at computing device 2 (306). The request may indicate a location in computing device 2 of a corresponding one or more application elements of the second application from which computing device 2 may generate the second one or more application elements of the first application 18. Computing device 2 may install application 18 using the first one or more application elements and the second one or more application elements.

In some examples, application provider server 4 may determine that the first one or more application elements of the plurality of application elements of the first application 18 cannot be obtained from another application that is already installed at computing device 2. In some examples, application provider server 4 may determine that the second one or more application elements of the plurality of application elements of the first application 18 can be obtained from the second application that is already installed at computing device 2.

In some examples, application provider server 4 may determine whether to send a third one or more application elements of the plurality of application elements of the first application to the computing device or whether to send a request to computing device 2 to obtain the third one or more application elements of the plurality of application elements of the first application from another application installed at computing device 2 based at least in part on one or more of: user sensitivity to an amount of time for installing the first application 18, a type of a network connection of computing device 2, available bandwidth of the network connection of computing device 2, a location of computing device 2, a remaining battery life of the computing device 2, processor characteristics of the computing device 2, and memory characteristics of computing device 2.

In some examples, sending the first one or more application elements of the plurality of application elements of the first application 18 to computing device 2 may include compressing each of the one or more application elements of the first application 18. In some examples, application provider server 4 may apply a different compression algorithm to each different application element type to compress the first one or more application elements. If the one or more application elements includes two or more application elements of two or more application element types, application provider server 4 may apply a first compression algorithm to a first application element of a first application element type of the two or more application elements, and may apply a second compression algorithm different from the first compression algorithm to a second application element of a second application element type of the two or more application elements.

In some examples, application provider server 4 may reorganize code in the second one or more application elements of the plurality of application elements of the first application 18 to increase a number of contiguous blocks in the code that match contiguous blocks in one or more application elements of the second application that is installed at the computing device 2 to reduce a size of a patch that is applied to the one or more application elements of the second application that is installed at the computing device 2 to obtain the second one or more application elements of the plurality of application elements of the first application 18.

The following numbered examples may illustrate one or more aspects of the present disclosure.

EXAMPLE 1

A method comprising: receiving, by one or more processors of a computing device from an external computing device, a first one or more application elements of a plurality of application elements of a first application that is to be installed at the computing device; obtaining, by the one or more processors and from a second application that is installed at the computing device, a second one or more application elements of the plurality of application elements of the first application that is to be installed at the computing device; and installing, by the one or more processors and using the first one or more application elements and the second one or more application elements, the first application at the computing device.

EXAMPLE 2

The method of Example 1, further comprising: receiving, by the one or more processors from the external computing device, an indication of one or more application elements of the second application that are to be used to install the first application; and generating, by the one or more processors, the second one or more application elements based at least in part on the one or more application elements of the second application.

EXAMPLE 3

The method of Example 2, wherein generating the second one or more application elements based at least in part on the one or more application elements of the second application further comprises: retrieving, by the one or more processors, a copy of one or more application elements of the second application for use as the second one or more application elements of the first application.

EXAMPLE 4

The method of Example 2, wherein generating the second one or more application elements based at least in part on the one or more application elements of the second application further comprises: applying, by the one or more processors, a patch received from the external computing device to the one or more application elements of the second application to generate an updated version of the one or more application elements; and using, by the one or more processors, the updated version of the one or more application elements as the second one or more application elements of the first application.

EXAMPLE 5

The method of Example 4, wherein: the second one or more application elements comprise a first version of a library; the one or more application elements of the second application comprises a second version of the library that is a previous version of the library; and applying the patch received from the external computing device to the one or more application elements of the second application comprises applying the patch to the one or more application elements of the second application to update the second version of the library to the first version of the library.

EXAMPLE 6

The method of any of Examples 1-5, further comprising: obtaining, by the one or more processors and from a third application that is installed at the computing device, a third one or more application elements of the plurality of application elements of the first application that is to be installed at the computing device; wherein the one or more processors further uses the third one or more application elements to install the first application at the computing device.

EXAMPLE 7

The method of any of Examples 1-6, wherein the plurality of application elements of the first application comprises one or more of: managed code, native code, resources, and compiled resources.

EXAMPLE 8

The method of Examples 1-7, wherein the one or more application elements received from the external computing device includes two or more types of application elements, and wherein each of the two or more types of application elements are compressed using a different compression algorithm.

EXAMPLE 9

The computing device comprising: a memory; and one or more processors operably coupled to the memory and configured to: receive, from an external computing device, a first one or more application elements of a plurality of application elements of a first application that is to be installed at the computing device; obtain from a second application that is installed at the computing device, a second one or more application elements of the plurality of application elements of the first application that is to be installed at the computing device; and install, using the first one or more application elements and the second one or more application elements, the first application at the computing device.

EXAMPLE 10

The system of Example 9, wherein the one or more processors are further configured to: receive, from the external computing device, an indication of one or more application elements of the second application that are to be used to install the first application; and generate the second one or more application elements based at least in part on the one or more application elements of the second application.

EXAMPLE 11

The system of Example 10, wherein the one or more processors are further configured to: retrieve a copy of one or more application elements of the second application for use as the second one or more application elements of the first application.

EXAMPLE 12

The system of Example 10, wherein the one or more processors are further configured to: apply a patch received from the external computing device to the one or more application elements of the second application to generate an updated version of the one or more application elements; and use the updated version of the one or more application elements as the second one or more application elements of the first application.

EXAMPLE 13

The system of Example 12, wherein the second one or more application elements comprise a first version of a library; the one or more application elements of the second application comprises a second version of the library that is a previous version of the library; and the one or more processors are further configured to apply the patch to the one or more application elements of the second application to update the second version of the library to the first version of the library.

EXAMPLE 14

The system of any of Examples 9-13, wherein: the one or more processors are further configured to obtain, from a third application that is installed at the computing device, a third one or more application elements of the plurality of application elements of the first application that is to be installed at the computing device; and the one or more processors further uses the third one or more application elements to install the first application at the computing device.

EXAMPLE 15

The system of any of Examples 9-14, wherein the plurality of application elements of the first application comprises one or more of: managed code, native code, resources, and compiled resources.

EXAMPLE 16

The system of any of Examples 9-15, wherein the one or more application elements received from the external computing device includes two or more types of application elements; and wherein each of the two or more types of application elements are compressed using a different compression algorithm.

EXAMPLE 17

A computing system comprising: an external computing device; and a computing device operably connected to the computing device via a network that is operable to: receive, from the external computing device, a first one or more application elements of a plurality of application elements of a first application that is to be installed at the computing device; obtain from a second application that is installed at the computing device, a second one or more application elements of the plurality of application elements of the first application that is to be installed at the computing device; and install, using the first one or more application elements and the second one or more application elements, the first application at the computing device.

EXAMPLE 18

The computing system of Example 17, wherein the external computing device is further operable to: determine whether to send a third one or more application elements of the plurality of application elements of the first application to the computing device based at least in part on one or more of: user sensitivity to an amount of time for installing the first application, a type of a network connection of the computing device, available bandwidth of the network connection of the computing device, a location of the computing device, a remaining battery life of the computing device, processor characteristics of the computing device, and memory characteristics of the computing device.

EXAMPLE 19

The computing system of any of Examples 17 and 18, wherein the first one or more application elements comprises two or more application elements of two or more application element types, and wherein the external computing device is further operable to: apply a first compression algorithm to a first application element of the two or more application elements, wherein the first application element is of a first application element type; and apply a second compression algorithm different from the first compression algorithm to a second application element of the two or more application elements, wherein the second application element is of a second application element type.

EXAMPLE 20

The computing system of any of Examples 17-19, wherein the external computing device is further operable to: reorganize code in the second one or more application elements of the plurality of application elements of the first application to increase a number of contiguous blocks in the code that match contiguous blocks in one or more application elements of the second application that is installed at the computing device to reduce a size of a patch that is applied to the one or more application elements of the second application that is installed at the computing device to obtain the second one or more application elements of the plurality of application elements of the first application.

EXAMPLE 21

A computing system comprising means for performing the method of any of Examples 1-8.

EXAMPLE 22

A computer-readable storage medium storing instructions that, when executed by at least one processor, cause the at least one processor to perform the method of any of Examples 1-8.

EXAMPLE 23

The method of any combination of examples 1-8.

EXAMPLE 24

A computing system comprising at least one processor configured to perform the method of any combination of examples 1-8.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable medium may include computer-readable storage media or mediums, which corresponds to a tangible medium such as data storage media, or communication media including any medium that facilitates transfer of a computer program from one place to another, e.g., according to a communication protocol. In this manner, computer-readable medium generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other storage medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage mediums and media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable medium.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various embodiments have been described. These and other embodiments are within the scope of the following claims.

What is claimed is:
1. A method comprising:
receiving, by one or more processors of a computing device and from an external computing device, a first one or more application elements of a plurality of application elements of a first application that is to be installed at the computing device;
receiving, by the one or more processors and from the external computing device, a request to obtain, from a second application that is installed at the computing device, a second one or more application elements of the plurality of application elements of the first application that is to be installed at the computing device, wherein at least one of the second one or more application elements of the plurality of application elements is not shared between the second application and the first application;
obtaining, by the one or more processors, from the second application that is installed at the computing device, and responsive to the request, the second one or more application elements of the plurality of application elements of the first application that is to be installed at the computing device; and
installing, by the one or more processors, and using the first one or more application elements and the second one or more application elements, including the at least one of the second one or more application elements of the plurality of application elements that is not shared between the second application and the first application, the first application at the computing device.
2. The method of claim 1, wherein obtaining the second one or more application elements comprises retrieving, by the one or more processors, a copy of one or more appli- cation elements of the second application for use as the second one or more application elements of the first application.

3. The method of claim 1, wherein obtaining the second one or more application elements comprises:
applying, by the one or more processors, a patch received from the external computing device to one or more application elements of the second application to generate an updated version of the one or more application elements; and
using, by the one or more processors, the updated version of the one or more application elements as the second one or more application elements of the first application.

4. The method of claim 3, wherein:
the second one or more application elements comprise a first version of a library;
the one or more application elements of the second application comprises a second version of the library that is a previous version of the library; and
applying the patch received from the external computing device to the one or more application elements of the second application comprises applying the patch to the one or more application elements of the second application to update the second version of the library to the first version of the library.

5. The method of claim 1, further comprising:
obtaining, by the one or more processors and from a third application that is installed at the computing device, a third one or more application elements of the plurality of application elements of the first application that is to be installed at the computing device;
wherein installing the first application at the computing device comprises installing, using the first one or more application elements, the second one or more application elements, and the third one or more application elements, the first application at the computing device.

6. The method of claim 1,
wherein the first one or more application elements received from the external computing device includes two or more types of application elements; and
wherein each of the two or more types of application elements are compressed using a different compression algorithm.

7. The method of claim 1, further comprising setting a permission of a copy of the second one or more application elements so that the first application is able to access the copy of the second one or more application elements,
wherein installing the first application includes installing, using the first one or more application elements and the copy of the second one or more application elements, the first application at the computing device.

8. A computing device comprising:
a memory; and
one or more processors operably coupled to the memory and configured to:
receive, from an external computing device, a first one or more application elements of a plurality of application elements of a first application that is to be installed at the computing device;
receive, by the one or more processors and from the external computing device, a request to obtain, from a second application that is installed at the computing device, a second one or more application elements of the plurality of application elements of the first application that is to be installed at the computing device, wherein at least one of the second one or more application elements of the plurality of application elements is not shared between the second application and the first application;
obtain, from the second application that is installed at the computing device, and responsive to the request, the second one or more application elements of the plurality of application elements of the first application that is to be installed at the computing device; and
install, using the first one or more application elements and the second one or more application elements, including the at least one of the second one or more application elements of the plurality of application elements that is not shared between the second application and the first application, the first application at the computing device.

9. The computing device of claim 8, wherein the one or more processors are configured to retrieve a copy of one or more application elements of the second application for use as the second one or more application elements of the first application.

10. The computing device of claim 8, wherein the one or more processors are configured to:
apply a patch received from the external computing device to the one or more application elements of the second application to generate an updated version of the one or more application elements; and
use the updated version of the one or more application elements as the second one or more application elements of the first application.

11. The computing device of claim 10, wherein:
the second one or more application elements comprise a first version of a library;
the one or more application elements of the second application comprises a second version of the library that is a previous version of the library; and
the one or more processors are further configured to apply the patch to the one or more application elements of the second application to update the second version of the library to the first version of the library.

12. The computing device of claim 8, wherein:
the one or more processors are further configured to obtain, from a third application that is installed at the computing device, a third one or more application elements of the plurality of application elements of the first application that is to be installed at the computing device; and
the one or more processors are configured to install, using the first one or more application elements, the second one or more application elements, and the third one or more application elements, the first application at the computing device.

13. The computing device of claim 8,
wherein the first one or more application elements received from the external computing device includes two or more types of application elements; and
wherein each of the two or more types of application elements are compressed using a different compression algorithm.

14. A computing system comprising:
an external computing device comprising one or more first processors; and
a computing device operably connected to the external computing device via a network, the computing device including one or more second processors configured to:
receive, from the external computing device, a first one or more application elements of a plurality of application elements of a first application that is to be installed at the computing device;

receive, from the external computing device, a request to obtain, from a second application that is installed at the computing device, a second one or more application elements of the plurality of application elements of the first application that is to be installed at the computing device, wherein at least one of the second one or more application elements of the plurality of application elements is not shared between the second application and the first application;

obtain, from the second application that is installed at the computing device, and responsive to the request, the second one or more application elements of the plurality of application elements of the first application that is to be installed at the computing device; and install, using the first one or more application elements and the second one or more application elements, including the at least one of the second one or more application elements of the plurality of application elements that is not shared between the second application and the first application, the first application at the computing device.

15. The computing system of claim 14, wherein the one or more first processors are further configured to:

determine whether to send a third one or more application elements of the plurality of application elements of the first application to the computing device based at least in part on one or more of:

user sensitivity to an amount of time for installing the first application, a type of a network connection of the computing device, available bandwidth of the network connection of the computing device, a location of the computing device, a remaining battery life of the computing device, processor characteristics of the computing device, and memory characteristics of the computing device.

16. The computing system of claim 14, wherein the first one or more application elements comprises two or more application elements of two or more application element types, and wherein the one or more first processors are further configured to:

apply a first compression algorithm to a first application element of the two or more application elements, wherein the first application element is of a first application element type; and apply a second compression algorithm different from the first compression algorithm to a second application element of the two or more application elements, wherein the second application element is of a second application element type.

17. The computing system of claim 14, wherein the one or more first processors are further configured to:

reorganize code in the second one or more application elements of the plurality of application elements of the first application to increase a number of contiguous blocks in the code that match contiguous blocks in one or more application elements of the second application that is installed at the computing device to reduce a size of a patch that is applied to the one or more application elements of the second application that is installed at the computing device to obtain the second one or more application elements of the plurality of application elements of the first application.

18. The computing device of claim 14, wherein the one or more first processors are configured to determine whether to send the plurality of application elements based on one or more factors.

19. The computing device of claim 18, wherein the one or more factors include one or more of user sensitivity to an amount of time for installing the first application, characteristics of a network connection of the computing device, an available bandwidth of the network connection of the computing device, a type of the network connection of the computing device, a location of the computing device, and a remaining battery life of the computing device.

20. The computing device of claim 18, wherein the one or more factors include one or more of a utilization of the one or more second processors by any patches to be applied by the computing device to obtain the plurality of application elements, and a memory utilization of the patches to be applied by the computing device to obtain the plurality of application elements.

* * * * *